United States Patent [19]
Carobolante

[11] Patent Number: 5,293,445
[45] Date of Patent: Mar. 8, 1994

[54] AGC WITH NON-LINEAR GAIN FOR PLL CIRCUITS

[75] Inventor: Francesco Carobolante, Phoenix, Ariz.

[73] Assignee: SGS-Thomson Microelecetronics, Inc., Carrollton, Tex.

[21] Appl. No.: 890,944

[22] Filed: May 29, 1992

[51] Int. Cl.[5] .......................................... H02P 5/165
[52] U.S. Cl. .................... 388/813; 388/911; 388/912
[58] Field of Search .................. 388/809-815, 388/911, 912; 318/606-608, 600-601, 603

[56] References Cited

U.S. PATENT DOCUMENTS

| | | | |
|---|---|---|---|
| 4,104,570 | 8/1978 | Hamby et al. | 388/813 |
| 4,301,395 | 11/1981 | Furuhata et al. | 388/813 |
| 4,464,620 | 8/1984 | Schwager et al. | 388/813 X |
| 4,543,516 | 9/1985 | Kobori et al. | 388/813 |
| 4,564,794 | 1/1986 | Kilen et al. | 388/813 |
| 4,599,545 | 7/1986 | Moriki et al. | 388/813 |
| 4,739,237 | 4/1988 | Maruta | 388/608 |
| 4,816,722 | 3/1989 | Shigemori | 388/813 |
| 5,087,994 | 2/1992 | Fukushima | 388/813 X |
| 5,093,891 | 3/1992 | Komiyama et al. | 388/813 |

Primary Examiner—William M. Shoop, Jr.
Assistant Examiner—David Martin
Attorney, Agent, or Firm—Richard A. Bachand; Lisa K. Jorgenson; Richard K. Robinson

[57] ABSTRACT

A circuit automatically changes the gain in a PLL for driving a motor of the type having a motor speed signal that indicates the speed of motor rotation. The circuit includes a phase detector for sensing a phase difference between the motor speed signal and a reference frequency and for producing an output signal of duration proportional to the sensed phase difference. A counter counts clock pulses throughout the duration of the output signal, and a motor driving circuit drives the motor in response to the count reached by the counter. A source of clock pulses provides clock signals at first and second frequencies, the second frequency being lower than the first frequency, and a lock range sense circuit produces a sense signal output that indicates when the PLL is within a predetermined phase difference range. A circuit responsive to the sense signal output selectively applies the first frequency to clock the counter when the PLL is within the predetermined phase difference range, and to apply the second frequency to clock the counter when the PLL is operating outside of the predetermined phase difference range.

22 Claims, 3 Drawing Sheets

AGC WITH NON-LINEAR GAIN FOR PLL CIRCUITS

BACKGROUND OF THE INVENTION

1. Field of the Invention

This invention relates to improvements in circuitry and methods for operating a phase-locked loop (PLL), and more particularly to improvements in circuitry and methods for reducing the steady state error of the PLL and increasing the capture range of the PLL during convergence by automatically changing the gain of the phase detector.

2. Technical Background

This invention pertains to phase-locked loop circuits of the type that use a phase detector, an integrating filter, and a variable frequency feedback circuit to track accurately an input signal at a reference frequency. In a broad sense, the variable frequency circuit can be a voltage-controlled oscillator (VCO). However, in the embodiment illustrated herein, the variable frequency circuit includes a variable speed motor and a generator that produces a signal of frequency dependent upon the speed of the motor. A phase detector determines the phase of the variable frequency signal with respect to the reference frequency. The phase detector then generates a dc voltage signal, which may be filtered by the integrating filter, to control the variable frequency signal, for example, by controlling the frequency of a VCO or by controlling the speed of the motor. The voltage signal forces the VCO to compensate, or changes the speed of the motor, when the variable frequency drifts from the reference frequency.

Typically when a PLL begins operation, the variable frequency requires a certain time to converge to the frequency of the input signal, until "lock" occurs. When lock occurs, the variable frequency tracks the input signal, and the PLL circuit functions in a feedback mode to maintain the lock. As known in the art, a higher gain applied to the signal from the phase detector reduces the steady state operation error. On the other hand, a low gain applied to the phase detector output signal widens the lock, or capture, range.

What is needed is a circuit and method that will provide a lower gain when the phase error between the reference frequency and the variable frequency is large, during convergence, and a higher gain when the phase error is low, when lock has been, or is close to being, attained.

SUMMARY OF THE INVENTION

Considering the above, therefore, it is an object of the invention to provide an improved apparatus and method for reducing steady-state errors in a PLL circuit.

It is another object of the invention to provide a method and circuit for increasing the capture range bandwidth in the operation of a PLL circuit.

It is another object of the invention to provide a PLL circuit in which the gain of the phase detector automatically increases when the PLL circuit is operating in locked-mode and lowers when the circuit is operating in a convergence mode.

It is still another object of the invention to provide an improved apparatus and method of the type described to reduce steady-state error, and increase capture range bandwidth, in the operation of a PLL circuit used for driving a motor.

It is yet another object of the invention to provide an improved circuit having the advantages of the above described method and apparatus that can be integrated in a single integrated-circuit chip.

These and other objects, features, and advantages of the invention will be apparent to those skilled in the art from the following detailed description of the invention, when read with the drawings and appended claims.

According to a broad aspect of the invention, a circuit is provided for automatically changing the gain in a PLL used for driving a motor. The motor is of the type having a motor speed signal that indicates the speed of motor rotation. The circuit includes a phase detector for sensing a phase difference between the motor speed signal and a reference frequency. The phase detector produces an output signal of duration proportional to the sensed phase difference. A counter counts clock pulses throughout the duration of the output signal, and a motor driving circuit drives the motor in response to the count reached by the counter. A source of clock pulses provides clock signals at first and second frequencies, the second frequency being lower than the first frequency. A lock range sense circuit produces a sense signal output that indicates when the PLL is within a predetermined phase difference range. A circuit responsive to the sense signal output selectively applies the first frequency to clock the counter when the PLL is within the predetermined phase difference range, and applies the second frequency to clock the counter when the PLL is operating outside the predetermined phase difference range.

According to another broad aspect of the invention, a method for automatically changing the gain in a PLL for driving a motor of the type having a motor speed signal that indicates the speed of motor rotation is provided. A signal of duration proportional to a phase difference between a motor speed signal and a reference frequency is produced, and a counter is enabled to count clock pulses during the duration of the signal of duration proportional to the phase difference. The motor is driven at a speed relative to the count of the counter. If the PLL is within a predetermined phase difference range the frequency of clock pulses to the counter is controlled to be at a first frequency. If the PLL is outside the predetermined phase difference range, the frequency of clock pulses to the counter is controlled to be at a second frequency, lower than said first frequency.

BRIEF DESCRIPTION OF THE DRAWINGS

The invention is illustrated in the drawings, in which.

In the various figures of the drawings, like reference numerals denote like or similar parts.

DETAILED DESCRIPTION OF THE PREFERRED EMBODIMENT

Figure 1:
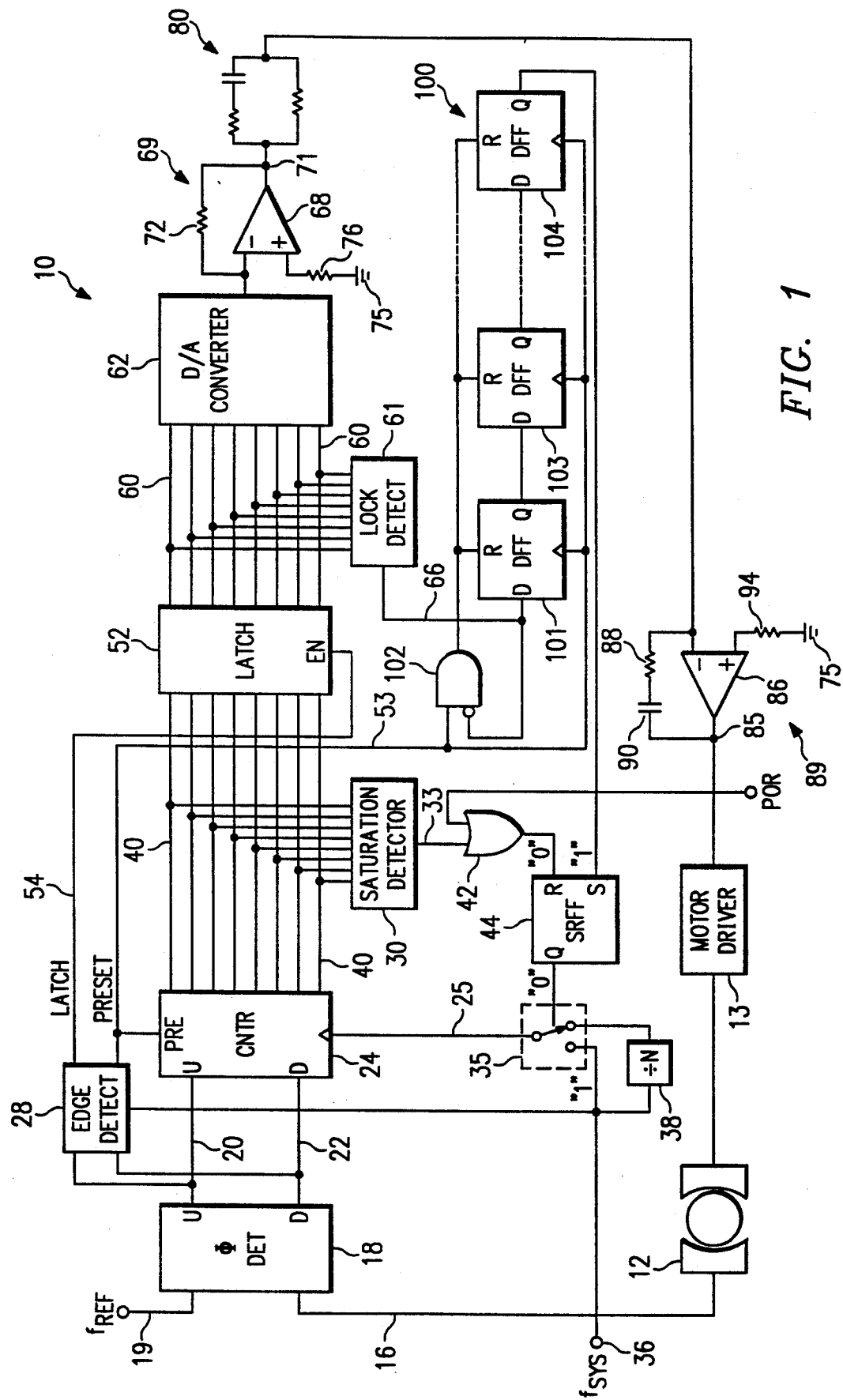
FIG. 1 is an electrical schematic diagram of a PLL circuit with non-linear gain according to a preferred embodiment of the invention for driving a motor connected to the PLL circuit.

An electrical schematic block diagram of a digital AGC circuit 10 in which the apparatus and method according to the preferred embodiment of the invention may be incorporated is shown in FIG. 1. The FIG. 1 embodiment shows the subject matter of the invention and the associated processing and motor devices to provide a suitable context for the invention. The digital AGC circuit 10 provides different gains for use in a PLL circuit.

Although the digital AGC circuit 10 can be constructed of discrete components, preferably it is integrated onto a single semiconductor chip adapted for connection into a PLL system. While PLL systems sometimes find particular application in motor driving circuits, it is to be appreciated that PLL circuits, and therefore the digital AGC circuit 10, may be employed in a variety of applications.

The PLL circuit 10 embodiment shown in FIG. 1 is used for driving a motor 12. Accordingly, standard motor driving circuitry is provided including a transconductance loop and other associated circuitry, denoted by the box 13 labeled "motor driver." A signal is derived on a line 16 from the motor 12 and associated electronics that indicates the speed at which the motor 12 is rotating. The signal is referred to herein as the "motor speed signal." The motor speed signal on the line 16 is connected to one input of a phase detector 18. A reference frequency signal is applied on a line 19 to another input of the phase detector 18 for comparison with the motor speed signal on the line 16. Thus, the frequency/phase detector 18, which may be, for example a commercially available phase detector, such as an MC4044 phase/frequency detector circuit, detects a phase difference between the two signals.

The frequency/phase detector 18 has two outputs, one on line 20 and the other on line 22. The output on the line 20 indicates that the reference frequency on line 19 leads the phase motor speed signal on line 16. This indicates that the motor speed is less than the desired speed, and needs to be increased. On the other hand, the output on the line 22 indicates that the phase motor speed signal on line 16 leads the reference frequency on line 19. This indicates that the motor speed exceeds the desired speed, and needs to be slowed.

In addition, the frequency/phase detector 18 determines the time difference between the occurrence of the incoming pulse edges of the motor speed signal on line 16 and the reference frequency on line 19. Thus, the output on either line 20 or 22 from the frequency/phase detector 18 is a pulse of length equal or proportional to the time difference between the active edges of the pulses on lines 16 and 19. The pulses on lines 20 and 22 control the counter 24 to which they are respectively applied to count either up or down for that time. If the frequency/phase detector 18 detects the falling edge of a motor speed signal pulse on line 16 before it detects a falling edge of the reference frequency on line 19, it will emit a pulse on the "down" line 22 to control the counter 24 to count down. On the other hand, if the falling edge of the reference frequency on line 19 arrives before the falling edge of the motor speed signal pulse on line 16, the frequency/phase detector 18 emits a pulse on the "up" line 20. As noted, the length of the frequency/phase detector 18 output pulse in any event is equal or proportional to the phase difference of the incoming signals.

The counter 24 is connected to receive clock pulses on a line 25, the clock pulses being either at a system frequency, $f_{SYS}$, or a divided system frequency, $f_{SYS}/N$, as below described in greater detail. In addition, the counter 24 is connected to be preset to a predetermined mid-value count (for example, 10000000 in an 8-bit counter) by a preset signal on a line 53 from an edge detector circuit 28, also below described in greater detail.

The outputs from the counter 24 on lines 40—40 are applied to a saturation detector 30. The saturation detector 30 produces an output signal on a line 33 for use in selecting the clock frequency applied to the counter 24, as below described. The function of the counter 24 can be performed by other types of counters. For instance, counters may be used that have a single input for counting either up or down depending on the sign of the pulse emitted from the phase detector 18. A qualifying gate pulse also may be provided to gate the clock in such embodiment.

The clock signals applied to the counter 24 are received from a switch 35. The switch 35 has two positions. The first position connects the line 25 directly to the system frequency, $f_{SYS}$, on input node 36. The other position connects the line 25 to a divided system frequency, $f_{SYS}/N$, derived by a frequency divider 38. The clock signals provided by the switch 25 are determined by whether the counter is operating in a saturation condition, as determined by the saturation detector 30.

Figure 3:
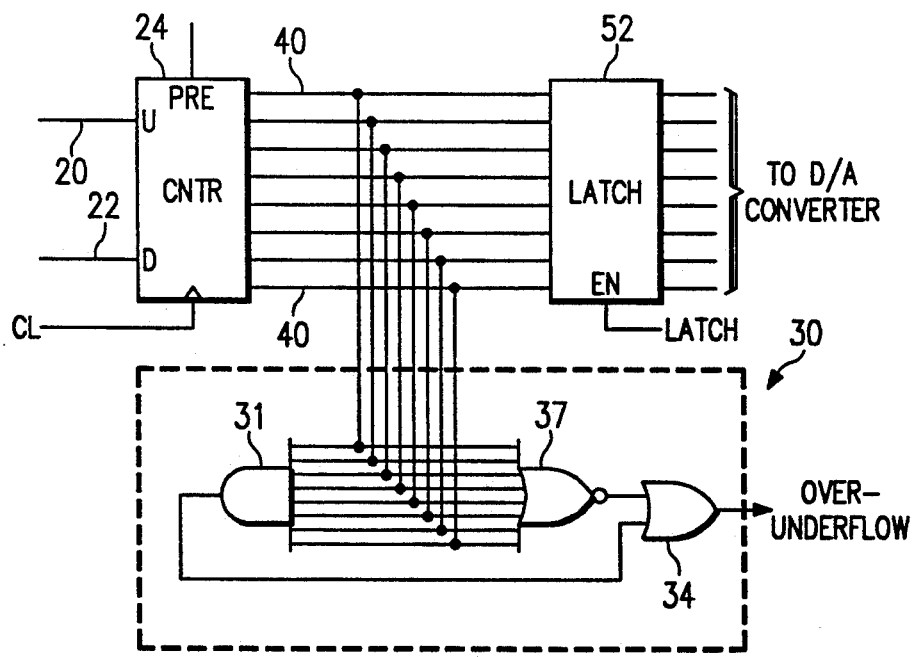
FIG. 3 is an electrical schematic diagram of the saturation detector of FIG. 1.

The details of the saturation detector 30 are shown in FIG. 3. The saturation detector 30 includes an AND gate 31 to the inputs of which each line 40—40 is connected. The output from the AND gate 31 is connected to one input of an OR gate 34. Additionally, a NOR gate 37 is provided to the inputs of which the lines 40—40 also are applied. The output from the NOR gate 37 is connected to another input of the OR gate 34. The output from the OR gate 34 represents the over/underflow, or saturation, signal that occurs when the counter 44 reaches a saturation state of either all ones or all zeros.

The output from the saturation detector 30 is applied by an OR gate 42 to reset a "set-reset flip-flop 44." The Q output of the flip-flop 44 is connected to control the switch 35 to select either the system frequency, $f_{SYS}$, directly from the node 36 or the divided system frequency, $f_{SYS}/N$, from the frequency divider 38. Thus, depending upon whether the counter 24 is saturated or not, as detected by the saturation detector 30, either the system frequency, $f_{SYS}$, or the divided system frequency, $f_{SYS}/N$, clocks the counter 24. If desired, other reset conditions can be used to control the clocking frequency of the counter 24. For example, a power on reset (POR) signal can be applied to the OR gate 42 also to serve to reset the flip-flop 44.

When the counter 24 is reset, it is initialized to count up or down from an intermediate count value centered between its upper and lower saturation values. Thus, for example, if the counter 24 is an 8-bit counter, when it is reset, it may be initialized to the count 10000000, from which either an up or down count can be made. Additionally, the counter 24 is of the type that stops counting when an overflow or underflow condition occurs to hold at the over- or underflow count, instead of continuing to count, or wrapping around. For this purpose the clock signal 25 can be gated by the output of the saturation detector. The counter 24 is reset after the termination of the counting period generated by either signal on line 20 or line 22.

Figure 2:
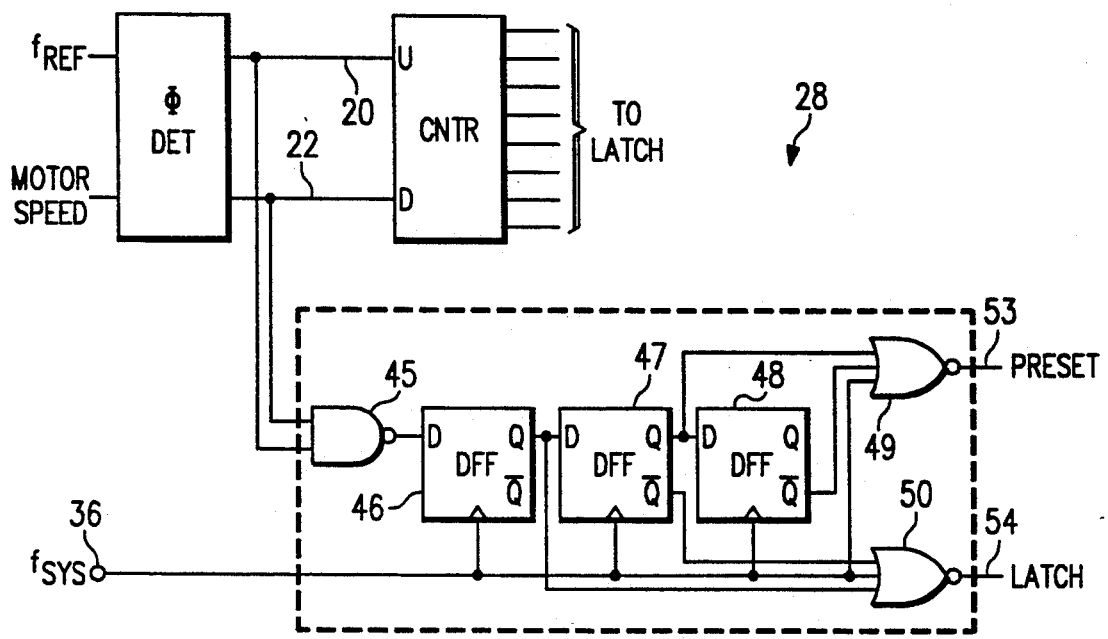
FIG. 2 is an electrical schematic diagram of the edge detector circuit of FIG. 1.

The termination of the signal is detected in the edge detector circuit 28, the details of which are shown in FIG. 2. The edge detector circuit 28 receives inputs from the up and down lines 20 and 22 at the inputs of a NAND gate 45. The output from the NAND gate 45 is connected to the D-input of a first D-type flip-flop 46. The Q output of the first D-type flip-flop 46 is connected to the D-input of a second D-type flip-flop 47, and to one input of a NOR gate 50. The output of the NOR gate 50 provides a "latch" signal on line 54 for use in the circuitry shown in FIG. 1. The Q output of the second D-type flip-flop 47 is connected to the D-input of a third D-type flip-flop 48 and to one input of a NOR gate 49. The output of the NOR gate 49 on the line 53 is used to provide the "preset" signal to the circuitry shown in FIG. 1. On the other hand, the Q(bar) output of the flip-flop 47 is connected to another input of the NOR gate 50. Finally, the Q(bar) output of the D-type flip-flop 48 is connected to another output of the NOR gate 49. The flip-flops 46, 47, and 48, as well as the NOR gates 49 and 50 are clocked by a system clock applied to the node 36.

A data latch 52 receives on its inputs the data carried on lines 40—40 from the counter 24. The function of the latch 52 is enabled by a "latch" signal on the line 54 from the edge detector circuit 28, indicating completion of the phase difference measurement. At this point the data output from the counter 24 is latched into the latch 52. The time in which the phase difference measurement is completed is, for example, when the falling edge of the last occurring pulse of the motor speed signal or the reference frequency occurs, as determined by the edge detector circuit 28.

The output of the latch 52 developed upon lines 60—60 is applied to a digital-to-analog converter circuit 62. The current output from the digital-to-analog converter 62 is connected to the inverting input of an amplifier circuit 69. The amplifier circuit 69 includes an operational amplifier 68 having a resistor 76 connected to an analog ground 75 from its non-inverting input terminal, and a feedback resistor 72 connected between its output and the inverting input. The amplifier circuit 69 is biased by the resistor 76 so that the voltage applied to the inverting input by the digital to analog converter 62 is equal to the voltage on the analog ground 75 when the digital to analog converter 62 is driven by the "reset" value (for example, 10000000). The amplifier circuit 69 can be eliminated if the digital to analog converter 62 has a voltage output, by exchanging the lines 20 and 22 to the counter 24 to maintain the correct sign of the signal.

The voltage output on the node 71 from the amplifier circuit 69 is applied to a filter circuit 80 and an integrator circuit 89 for application to the motor driver circuit 13. The integrator circuit 89 is of known construction, having an operational amplifier 86 and a resistor 94 connected between the non-inverting input terminal 92 and the analog ground 75. The output node 85 of the operational amplifier 86 is connected to the inverting input terminal by a capacitor 90 and resistor 88, connected in series.

The output from the power driver circuit 13 is connected to the motor 12 to control its rotation.

In operation, when the motor 12 and the PLL circuit 10 are initially started, the set-reset flip-flop 44 is reset by the POR signal. The flip-flop 44 operates the switch 35 to select the divided system frequency, $f_{SYS}/N$, produced at the output of the frequency divider 38. In addition, a great difference will initially exist between the frequencies of the motor speed signal on the line 16 and the reference frequency on line 19. During this time, the counter 24 rapidly counts until it reaches saturation. When this occurs, the saturation detector circuit 30 continues a signal to the reset terminal of the flip-flop 44 to hold the flip-flop 44 in its reset state.

Thus, the counter 24 counts the pulses until the end of the duration of the pulse on the line 20 or its own saturation. Then, the count of the counter 24 is latched into the latch 52. This binary number latched by the latch 52 is converted to an analog signal by the digital to analog converter 62 to produce an output voltage on the node 71.

Figure 5:
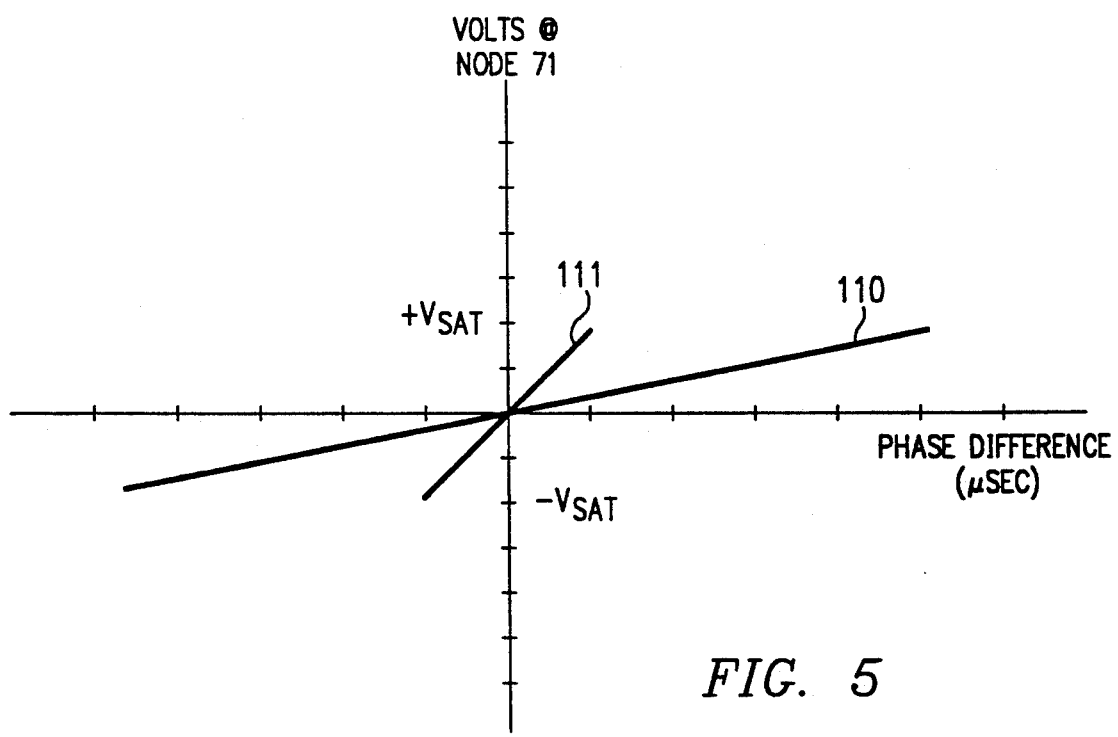
FIG. 5 is a graph of the output voltage of the phase detector circuit as a function of the phase difference between the reference frequency and a motor speed signal, showing two gain operating ranges, according to the invention.

During the initial startup time, or when the counter 24 is saturated, with the divided clock frequency at the output of the frequency divider 38 applied to clock the counter 24, the gain at which the output voltage is produced on node 71 is relatively low, as shown by line 110 in FIG. 5. Having a low gain during this time, or during a time in which lock may be lost for another reason, such as a temporary interruption or perturbation to the rotor of the motor 12, the low gain along line 110 assists in rapidly returning the circuit to a lock condition without significantly overshooting or over-correcting to achieve the lock condition (typically due to the saturation of the phase detector 18).

In contrast, when the PLL circuit 10 is operated within the lock range (i.e., the reference frequency closely matches and tracks the frequency and phase of the motor frequency signal as determined by the lock detector circuit 61) the counter 24 no longer saturates between reset pulses from the edge detector 28.

Figure 4:
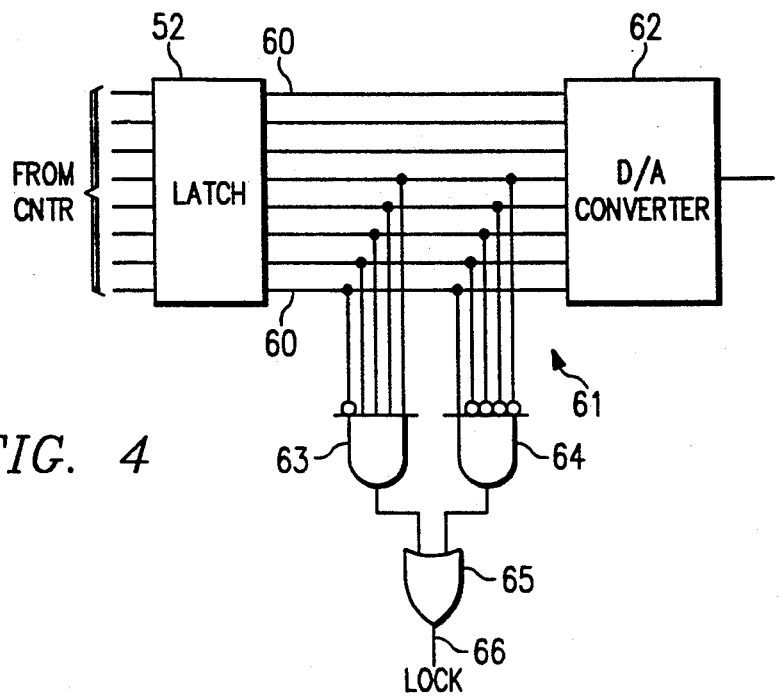
FIG. 4 is an electrical schematic diagram of the lock detector of FIG. 1.

The determination that the circuit 10 is operating within a predetermined phase difference, herein the "lock range," is determined by a lock detector circuit 61. The details of the lock detector circuit 61 are shown in FIG. 4. The lock detector circuit 61 has two AND gates 63 and 64. The four most significant bits are compared with the fifth most significant bit to find whether the states on the 5 most significant bit lines within lines 60—60 are either "01111" or "10000," to decide whether the count on lines 60—60 is within a predetermined range from the preset value (for example between 01111xxx and 10000xxx around the center count, 10000000). It will be appreciated, of course, that any desired lock range precision can be selected by the selection of the number of most significant bits compared by the AND gates 63 and 64. The outputs from the respective AND gates 63 and 64 are connected to the inputs of an OR gate 65, the output of which provides the "lock" signal on line 66.

The detection of a lock condition by the detector 61 on line 66 is used to set the flip-flop 44. To avoid false detections, a series of D-type flip-flops 100, 103, ... 104 may be provided, as shown. Thus, the output from the lock detector 61 is applied to the D-input of a first D-type flip-flop 101. The flip-flop 101 is clocked by the preset signal on line 53 developed by the edge detector circuit 28. In addition, the D-type flip-flop 101 is reset by the signal on the line 53 when the lock detector is producing no output. This condition is determined by AND gate 102. The number of similar flip-flops 103, ... 104 determines the number of cycles in which lock is detected before the gain of the PLL is changed.

In the lock condition (or within the lock range as described above), as determined by the lock detector 61 and confirmed by passage through the series of D-type flip-flops 101, 103 ... 104, the flip-flop 44 is set, thus commutating switch 35 to apply the system frequency, $f_{SYS}$, from node 36 directly to clock the counter 24. During operation in this range, the counter 24 produces a voltage on node 71 that follows the line 111 as shown in FIG. 5. It can therefore be seen that in the lock range, the circuit 10 has a higher gain throughout the range of the counter 24, due to the difference in the clocking frequency.

It should be noted that multiple break points can be provided, if desired, by using a counter (not shown) in place of the flip-flop 44 and multiple dividers (also not shown) in conjunction with divider 38, so that in each range, a "set" pulse moves into a higher frequency range, and a "reset" returns to the previous, lower frequency, range. In addition the output range of the digital to analog converter 62 may also be changed by the Q output of the flip-flop 44, if appropriate for system stability.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A circuit for automatically changing the gain in a PLL for driving a motor of the type having a motor speed signal that indicates the speed of motor rotation, comprising:
   a phase detector for sensing a phase difference between the motor speed signal and a reference frequency and for producing an output signal of duration proportional to the sensed phase difference;
   a counter;
   a motor driving circuit for driving said motor in response to the count reached by said counter through the duration of the phase detector output signal;
   a source of clock pulses at a first frequency and a second frequency, said second frequency being lower than said first frequency;
   a lock range sense circuit to produce a sense signal output that indicates when said PLL is within a predetermined phase difference range;
   and a circuit responsive to said sense signal output for selectively applying said first frequency to clock said counter when said PLL is within said predetermined phase difference range, and to apply said second frequency to clock said counter when said PLL is operating outside said predetermined phase difference range.

2. The circuit of claim 1 wherein said source of clock pulses comprises a source of clock pulses at the first frequency, and a frequency divider to receive the clock pulses at the first frequency to produce an output at a second frequency divided from said first frequency.

3. The circuit of claim 1 wherein said circuit responsive to said sense signal output comprises a switch, a saturation detector to produce a saturation signal when said counter is in saturation, and a flip flop that is set by the output from said lock range sense circuit and reset by said saturation signal, an output of said flip flop being connected to said switch to select said first or second frequency in response to said flip flop being set or reset.

4. The circuit of claim 1 further comprising a latch connected to receive the count reached by said counter, and circuitry to determine the duration of said phase detector output signal and having an output connected to said latch to enable said latch to hold the count reached by said counter.

5. The circuit of claim 1 wherein said lock range sense circuit is connected to receive an output of said latch to produce a sense signal output that indicates when said PLL is within a predetermined phase difference range.

6. The circuit of claim 5 wherein said lock range sense circuit is connected to detect the states on a predetermined number of output lines from said latch.

7. The circuit of claim 6 further comprising a delay circuit to which the output of said lock range sense circuit is applied, said delay circuit having an output connected to select said first frequency only after said lock range sense circuit has sensed that said PLL is within the predetermined phase difference range for a predetermined number of comparisons between the motor speed signal and the reference frequency.

8. The circuit of claim 7 wherein said delay circuit comprises a plurality of flip flop circuits.

9. The circuit of claim 8 wherein said plurality of flip flop circuits provide one flip flop circuit for each number of said predetermined number of comparisons between the motor speed signal and the reference frequency.

10. The circuit of claim 1 wherein said phase detector produces a pulse in response to a comparison between said motor speed signal and the reference frequency on a first line if the motor speed signal lags the reference frequency and on a second line if the motor speed signal leads the reference frequency.

11. The circuit of claim 10 wherein said first and second lines of said phase detector are connected to produce up and down counts of said counter.

12. The circuit of claim 11 further comprising circuitry to preset said counter to a mid-range value after the duration of each of said phase detector output signals.

13. The circuit of claim 1 wherein said a motor driving circuit comprises an integrating filter and a motor driver.

14. A circuit for automatically changing the gain in a PLL for driving a motor of the type having a motor speed signal that indicates the speed of motor rotation, comprising:
   a phase detector for sensing a phase difference between the motor speed signal and a reference frequency and for producing an output signal of duration proportional to the sensed phase difference;
   a counter;
   a latch to receive an output count from said counter;
   a motor driving circuit for driving said motor in response to the count reached by said counter through the duration of the phase detector output signal;
   a source of clock pulses at first and second frequencies, said second frequency being lower than said first frequency;
   circuitry to determine the duration of said phase detector output signal and having an output connected to said latch to enable said latch to hold the count reached by said counter through the duration of said phase detector output signal;

a lock range sense circuit connected to receive the output of said latch to produce a lock signal output that indicates when said PLL is within a predetermined phase difference range;

a saturation detector to produce a saturation signal when said counter is in saturation;

and a circuit responsive to said lock signal output for selectively applying said first frequency to clock said counter and responsive to said saturation signal to apply said second frequency to clock said counter.

15. The circuit of claim 14 wherein said circuit responsive to said lock signal output for selectively applying said first frequency to clock said counter and responsive to said saturation signal to apply said second frequency to clock said counter comprises a flip flop that is set by the lock signal output and reset by said saturation signal, an output of said flip flop being connected to select said first or second frequency in response to said flip flop being set or reset.

16. The circuit of claim 14 wherein said source of clock pulses at first and second frequencies comprises a source of clock pulses at the first frequency, and a frequency divider to receive clock pulses at the first frequency to produce an output at a second frequency divided from said first frequency.

17. The circuit of claim 15 further comprising a delay circuit to which said lock signal is applied, said delay circuit having an output connected to set said flip flop to select said second frequency only after said lock range sense circuit has sensed that said PLL is within the predetermined phase difference range for a predetermined number of comparisons between the motor speed signal and the reference frequency.

18. The circuit of claim 14 wherein said phase detector produces a pulse in response to a comparison between said motor speed signal and the reference frequency on a first line if the motor speed signal lags the reference frequency and on a second line if the motor speed signal leads the reference frequency.

19. The circuit of claim 18 wherein said first and second lines of said phase detector are connected to produce up and down counts of said counter.

20. The circuit of claim 19 further comprising circuitry to preset said counter to a mid-range value after the duration of each of said phase detector output signals.

21. A method for automatically changing the gain in a PLL for driving a motor of the type having a motor speed signal that indicates the speed of motor rotation, comprising:

producing a signal of duration proportional to a phase difference between a motor speed signal and a reference frequency;

enabling a counter to count clock pulses during the duration of the signal of duration proportional to the phase difference;

driving the motor to operate at a speed relative to the count of said counter;

detecting whether the PLL is within a predetermined phase difference range;

and controlling the frequency of clock pulses to the counter to be at a first frequency within a predetermined phase difference range and at a second frequency outside the predetermined phase difference range.

22. The method of claim 21 wherein said step of controlling the frequency of clock pulses to the counter to be at a first frequency within a predetermined phase difference range and at a second frequency outside the predetermined phase difference range comprises providing the first frequency at a higher frequency than the second frequency.

* * * * *

UNITED STATES PATENT AND TRADEMARK OFFICE
CERTIFICATE OF CORRECTION

PATENT NO. : 5,293,445
DATED : March 8, 1994
INVENTOR(S) : Francesco Carobolante It is certified that error appears in the above-indentified patent and that said Letters Patent is hereby corrected as shown below:

On the Title Page, Item [73], delete the word "Microelecetronics" and substitute --Microelectronics--.

Signed and Sealed this

Eighteenth Day of April, 1995

*Attest:*

BRUCE LEHMAN

*Commissioner of Patents and Trademarks*

*Attesting Officer*